United States Patent
Kishimoto et al.

(10) Patent No.: US 11,746,284 B2
(45) Date of Patent: Sep. 5, 2023

(54) COMPOSITION COMPRISING A SEMICONDUCTING LIGHT EMITTING NANOPARTICLE

(71) Applicant: Merck Patent GmbH, Darmstadt (DE)

(72) Inventors: Tadashi Kishimoto, Kanagawa (JP); Yuki Hirayama, Tokyo (JP); Tomohisa Goto, Kanagawa (JP); Masayoshi Suzuki, Tokyo (JP); Teruaki Suzuki, Kanagawa (JP)

(73) Assignee: Merck Patent GmbH, Darmstadt (DE)

( * ) Notice: Subject to any disclaimer, the term of this patent is extended or adjusted under 35 U.S.C. 154(b) by 524 days.

(21) Appl. No.: 16/625,170

(22) PCT Filed: Jun. 26, 2018

(86) PCT No.: PCT/EP2018/067019
§ 371 (c)(1),
(2) Date: Dec. 20, 2019

(87) PCT Pub. No.: WO2019/002239
PCT Pub. Date: Jan. 3, 2019

(65) Prior Publication Data
US 2020/0157419 A1  May 21, 2020

(30) Foreign Application Priority Data

Jun. 29, 2017 (EP) ..................... 17178715

(51) Int. Cl.
| | | |
|---|---|---|
| C09K 11/02 | (2006.01) |
| C08F 20/18 | (2006.01) |
| C08F 20/28 | (2006.01) |
| C08K 3/30 | (2006.01) |
| C08K 3/32 | (2006.01) |
| C08K 9/02 | (2006.01) |
| C09K 11/08 | (2006.01) |
| C09K 11/70 | (2006.01) |
| C09K 11/88 | (2006.01) |
| H01L 51/00 | (2006.01) |
| B82Y 20/00 | (2011.01) |
| H01L 51/50 | (2006.01) |

(52) U.S. Cl.
CPC .............. *C09K 11/02* (2013.01); *C08F 20/18* (2013.01); *C08F 20/28* (2013.01); *C08K 3/30* (2013.01); *C08K 3/32* (2013.01); *C08K 9/02* (2013.01); *C09K 11/0883* (2013.01); *C09K 11/70* (2013.01); *C09K 11/883* (2013.01); *H01L 51/0035* (2013.01); *B82Y 20/00* (2013.01); *C08K 2201/001* (2013.01); *C08K 2201/011* (2013.01); *H01L 51/502* (2013.01)

(58) Field of Classification Search
CPC ....................................................... C09K 11/02
See application file for complete search history.

(56) References Cited

U.S. PATENT DOCUMENTS

| | | | | |
|---|---|---|---|---|
| 4,128,537 A * | 12/1978 | Markiewitz | .......... | C07D 251/34 |
| | | | | 528/49 |
| 6,949,206 B2 * | 9/2005 | Whiteford | .............. | B82Y 15/00 |
| | | | | 252/500 |
| 10,509,251 B2 | 12/2019 | Yamada et al. | | |
| 10,784,417 B2 | 9/2020 | Kuniyasu et al. | | |
| 10,982,135 B2 | 4/2021 | Oba et al. | | |
| 2008/0135098 A1 * | 6/2008 | Ootani | ................... | H05B 33/24 |
| | | | | 136/263 |
| 2014/0264193 A1 | 9/2014 | Daniels et al. | | |
| 2017/0052444 A1 | 2/2017 | Park et al. | | |
| 2017/0191638 A1 * | 7/2017 | Kwon | ....................... | F21V 9/30 |
| 2018/0284613 A1 | 10/2018 | Hirayama et al. | | |
| 2019/0345357 A1 | 11/2019 | Kuniyasu et al. | | |

FOREIGN PATENT DOCUMENTS

| | | |
|---|---|---|
| EP | 3136174 A1 | 3/2017 |
| JP | 2006274077 A | 10/2006 |
| JP | 2014-174406 A | 9/2014 |
| JP | 2016145269 A | 8/2016 |
| JP | 2017021322 A | 1/2017 |
| JP | 2018119042 A | 8/2018 |
| JP | 2018120058 A | 8/2018 |
| WO | 2014/129067 A1 | 8/2014 |
| WO | 2017/054898 A1 | 4/2017 |
| WO | 2018043616 A1 | 3/2018 |

OTHER PUBLICATIONS

International Search Report dated Sep. 10, 2018 issued in corresponding PCT/EP2018/067019 application (3 pages).
English Abstract of JP 2014-174406 A published Sep. 22, 2014.
Office Action in corresponding JP appln. 2019572444 dated Jun. 8, 2022 (pp. 1-5) and english translation thereof pp. 1-5).

* cited by examiner

*Primary Examiner* — William D Young
(74) *Attorney, Agent, or Firm* — MILLEN, WHITE, ZELANO & BRANIGAN, PC; Ryan Pool

(57) ABSTRACT

The present invention relates to a composition comprising a semiconducting light emitting nanoparticle.

23 Claims, No Drawings

COMPOSITION COMPRISING A SEMICONDUCTING LIGHT EMITTING NANOPARTICLE

FIELD OF THE INVENTION

The present invention relates to a composition comprising a semiconducting light emitting nanoparticle, formulation, use of a composition, use of a formulation, an optical medium, and an optical device.

BACKGROUND ART

A semiconducting light emitting nanoparticle comprising a core and at least one ligand and a composition comprising a semiconducting light emitting nanoparticle are known in the prior art.

For example, as described in JP 2014-174406 A, WO 2014/129067 A1.

PATENT LITERATURE

1. JP 2014-174406 A
2. WO 2014/129067 A1

SUMMARY OF THE INVENTION

However, the inventors newly have found that there are still one or more of considerable problems for which improvement is desired, as listed below.

1. A novel composition or a formulation, comprising one or more of semiconducting light emitting nanoparticles showing improved dispersibility of said semiconducting light emitting nanoparticles in the composition, formulation, and/or in a film, is desired.

2. A novel composition or a formulation, comprising one or more of semiconducting light emitting nanoparticles showing improved initial Quantum Yield of said semiconducting light emitting nanoparticles in the composition, formulation and ./ or in a film, is requested.

3. A novel composition or a formulation, comprising one or more of semiconducting light emitting nanoparticles showing long term stability and stable Quantum Yield of said semiconducting light emitting nanoparticles in the composition or formulation, is requested 4. A novel composition or a formulation, comprising one or more of semiconducting light emitting nanoparticles, showing higher Optical Density ("OD") at an excitation wavelength, is desired.

5. A novel composition or a formulation, comprising one or more of semiconducting light emitting nanoparticles, showing better dispersibility of the semiconducting light emitting nanoparticles at higher concentration, is requested.

The inventors aimed to solve one or more of the above mentioned problems 1 to 5.

Then it was found a novel composition that solves the above described problems 1 to 5, wherein the composition comprising, essentially consisting of, or consisting of,
i) at least one semiconducting light emitting nanoparticle comprising a core, optionally one or more shell layers,
ii) at least one polymer,
wherein the polymer comprises at least a repeating unit A comprising a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the repeating unit A comprises a tertiary amine, phosphine oxide group, phosphonic acid, or a phosphate group,
and
iii) at least one (meth)acrylate represented by following chemical formula (I),

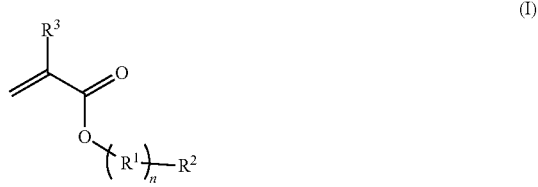

wherein n is 0 or 1, $R^1$ is a straight alkylene chain or alkoxylene chain having 1 to 15 carbon atoms, preferably 1 to 10 carbon atoms, more preferably 1 to 5 carbon atoms, $R^2$ is a branched or cyclic alkyl or alkoxy group having 3 to 40 carbon atoms, preferably a cyclic alkyl or alkoxy group having 3 to 40 carbon atoms, which may in each case be substituted by one or more radicals $R^a$, where one or more non-adjacent $CH_2$ groups may be replaced by $R^aC=CR^1$, $C≡C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;
$R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another; $R^3$ is H or $CH_3$.

In another aspect, the present invention also relates to a formulation comprising, essentially consisting of, or consisting of the composition,
and at least one solvent, preferably the solvent is selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, and dichlorobenzene, preferably said solvent is propylene glycol alkyl ether acetates, alkyl acetates, ethylene glycol monoalkyl ethers, propylene glycol, and propylene glycol monoalkyl ethers; more preferably the solvent is selected from one or more members of the group consisting of propylene glycol alkyl ether acetates, such as, propylene glycol monomethyl ether acetate (PGMEA), alkyl acetates such as butyl acetate, ethylene glycol monoalkyl ethers such as ethylene glycol monobutyl ether, propylene glycol or propylene glycol monoalkyl ethers such as methoxypropanol.

In another aspect, the present invention also relates to use of the composition, or the formulation, in an electronic device, optical device, in a biomedical device or for fabricating an electronic device, optical device or a biomedical device.

In another aspect, the present invention further relates to an optical medium comprising said composition or the formulation.

In another aspect, the present invention further relates to an optical device comprising said optical medium.

DETAILED DESCRIPTION OF THE INVENTION

According to the present invention, the composition comprising, essentially consisting of, or consisting of,
i) at least one semiconducting light emitting nanoparticle comprising a core, optionally one or more shell layers,
ii) at least one polymer,
wherein the polymer comprises at least a repeating unit A, preferably it is a constitutional repeating unit, comprising a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the repeating unit A comprises a tertiary amine, phosphine oxide group, phosphonic acid, or a phosphate group,
and
iii) at least one (meth)acrylate represented by following chemical formula (I),

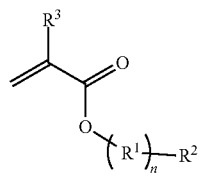

(I)

wherein n is 0 or 1, $R^1$ is a straight alkylene chain or alkoxylene chain having 1 to 15 carbon atoms, preferably 1 to 10 carbon atoms, more preferably 1 to 5 carbon atoms, $R^2$ is a branched or cyclic alkyl or alkoxy group having 3 to 40 carbon atoms, preferably a cyclic alkyl or alkoxy group having 3 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another; $R^3$ is H or $CH_3$.

Polymer

According to the present invention, the polymer comprises at least a repeating unit A comprising a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the repeating unit A comprises a tertiary amine, phosphine oxide group, phosphonic acid, or a phosphate group.

In some embodiments of the present invention, the repeating unit A and the repeating unit B are a constitutional repeating unit.

Even more preferably, the repeating unit A comprises a tertiary amine represented by following chemical formula (II), $$NR^4R^5R^6—$$ (II)

wherein $R^4$ is a hydrogen atom, a straight or a branched alkyl group having 1 to 30 carbon atoms, or an aryl group having 1 to 30 carbon atoms; $R^5$ is a hydrogen atom, a straight or a branched alkyl group having 1 to 30 carbon atoms, or an aryl group having 1 to 30 carbon atoms; $R^4$ and $R^5$ can be same or different of each other; $R^6$ is a single bond, a straight or a branched alkylene group having 1 to 30 carbon atoms, alkenylene group having 1 to 30 carbon atoms, (poly) oxaalkylene group having 1 to 30 carbon atoms.

Even more preferably, $R^4$ is a straight or a branched alkyl group having 1 to 30 carbon atoms; $R^5$ is a straight or a branched alkyl group having 1 to 30 carbon atoms; $R^4$ and $R^5$ can be same or different of each other.

Furthermore preferably, $R^4$ is methyl group, ethyl group, n-propyl group, or n-butyl group; $R^5$ is methyl group, ethyl group, n-propyl group, or n-butyl group.

According to the present invention, in a preferred embodiment, the repeating unit A does not contain a salt.

In a preferred embodiment of the present invention, the polymer is a copolymer selected from the group consisting of graft copolymers, block copolymers, alternating copolymers, and random copolymers, preferably said copolymer comprises the repeating unit A, and repeating unit B that does not include any phosphine group, phosphine oxide group, phosphate group, phosphonate group, thiol group, tertiary amine, carboxyl group, hetero cyclic group, silane group, sulfonic acid, hydroxyl group, phosphonic acid, and a combination of thereof, more preferably the copolymer is a block copolymer represented by following chemical formula (III) or (IV), $$A_n\text{-}B_m$$ (III)

$$B_o\text{-}A_n\text{-}B_m$$ (IV)

wherein the symbol "A" represents a repeating unit A; the symbol "B" is taken to mean the repeating unit B; the symbols "n", "m", and "o" are at each occurrence, independently or dependently of each other, integers 1 to 100, preferably 5 to 75, more preferably 7 to 50; even more preferably the repeating unit B comprises a polymer chain selected from the group consisting of (poly)ethylene, (poly)phenylene, polydivinylbenzene, (poly)ethers, (poly)esters, (poly)amides, (poly)urethanes, (poly)carbonates, polylactic acids, (poly)vinylesters, (poly)vinylethers, polyvinyl alcohols, polyvinylpyrrolidones, celluloses and derivatives of any of these.

In a preferred embodiment of the present invention, the polymer chain of the repeating unit B is a polyethylene glycol.

More preferably, the repeating unit B comprises a chemical structure represented by following chemical formula (VI), Chemical formula (VI)

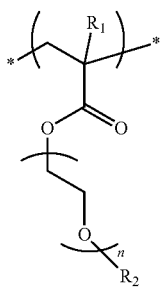

wherein the chemical formula (VI), $R_1$ is hydrogen atom, or methyl group; $R_2$ is alkyl group having 1 to 10 carbon atoms; and n is an integer 1 to 5, "*" represents the connecting point to an another polymer repeating unit or a terminal of the polymer.

Even more preferably, $R_1$ can be a hydrogen atom, or methyl group, $R_2$ can be an ethyl group, and n is an integer 1 to 5.

In some embodiments of the present invention, the surface of the core, or the outermost surface of one or more shell layers of the semiconducting light emitting nanoparticle can be partly or fully over coated by the polymer. By using ligand exchange method, described in for example, Thomas Nann, Chem. Commun., 2005, 1735-1736, DOI: 10.1039/b-414807j, the polymer can be introduced onto the surface of the core or the outermost surface of the core of the semiconducting light emitting nanoparticle.

In some embodiments of the present invention, at least one polymer represented by chemical formula (I) are physically or chemically attached onto the surface of the core or the outermost surface of the shell layers, preferably a plurality of polymers are attached onto the surface of the core or the outermost surface of the shell layers.

According to the present invention, in some embodiments, the content of said polymer is in the range from 1% to 500% by weight, more preferably in the range from 20% to 350% by weight, even more preferably from 50% to 200% by weight with respect to the total weight of the inorganic part of the semiconducting light emitting nanoparticle.

In a preferred embodiment of the present invention, the weight average molecular weight (Mw) of the polymer is in the range from 200 g/mol to 30,000 g/mol, preferably from 250 g/mol to 2,000 g/mol, more preferably from 400 g/mol to 1,000 g/mol.

The molecular weight $M_w$ is determined by means of GPC (=gel permeation chromatography) against an internal polystyrene standard.

As the polymer, commercially available wetting and dispersing additives which can be solved in non-polar and/or low polar organic solvent can be used preferably. Such as BYK-LPN6919, BYK-103, BYK-P104, BYK-163 ([trademark], from BYK com.), Poly(ethylene glycol) methyl ether amine (Sigma-Ald 767565 [trademark], from Sigma Aldrich), Polyester bis-MPA dendron, 32 hydroxyl, 1 thiol, (Sigma-Ald 767115 [trademark], from Sigma Aldrich), LIPONOL DA-T/25 (From Lion Specialty Chemicals Co.), Carboxymethyl cellulose (from Polyscience etc.), another wetting and dispersing additives disclosed in for examples, "Marc Thiry et. al., ACSNANO, American Chemical society, Vol. 5, No. 6, pp 4965-4973, 2011", "Kimihiro Susumu, et. al., J. Am. Chem. Soc. 2011, 133, pp 9480-9496".

Matrix Material

According to the present invention, the composition comprises at least one (meth)acrylate represented by following chemical formula (I),

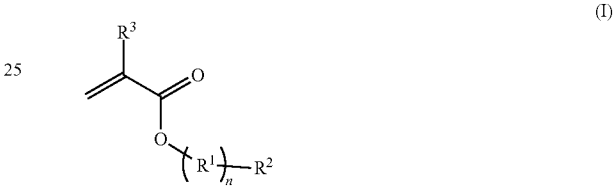

wherein n is 0 or 1, $R^1$ is a straight alkylene chain or alkoxylene chain having 1 to 15 carbon atoms, preferably 1 to 10 carbon atoms, more preferably 1 to 5 carbon atoms, $R^2$ is a branched or cyclic alkyl or alkoxy group having 3 to 40 carbon atoms, preferably a cyclic alkyl or alkoxy group having 3 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another; $R^3$ is H or $CH_3$.

Any types of publically available acrylates and/or methacrylates represented by chemical formula (I) can be used preferably.

Furthermore preferably, said $R^2$ of formula (I) is, at each occurrence, independently or differently, selected from the following groups, wherein the groups can be substituted with $R^a$, preferably they are unsubstituted by $R^a$.

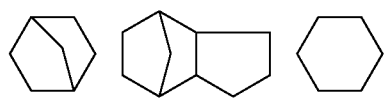

Particularly preferably, said R² of formula (I) is, at each occurrence, independently or differently, selected from the following groups.

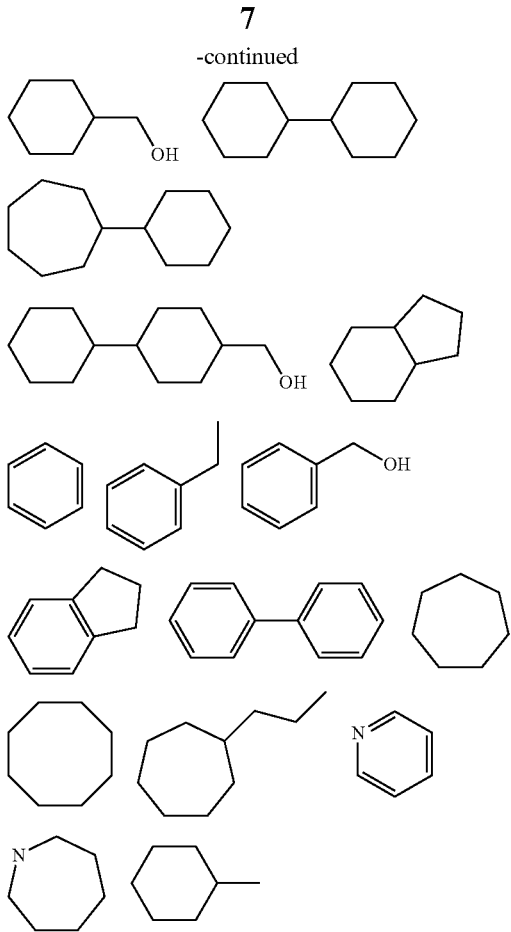

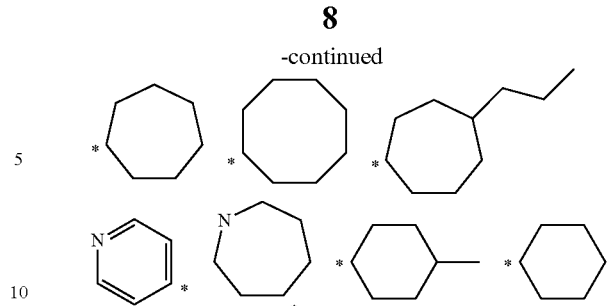

wherein "*" represents the connecting point to R¹ in case n is 1, and it is represents the connecting point to oxygen atom of the formulae in case n is 0.

The furthermore preferably, said formula (I) is a di-cyclopentanyl acrylate, or 1,4,-cyclohexanedimethanol mono-acrylate.

Semiconducting Light Emitting Nanoparticle

According to the present invention, the term "semiconductor" means a material that has electrical conductivity to a degree between that of a conductor (such as copper) and that of an insulator (such as glass) at room temperature. Preferably, a semiconductor is a material whose electrical conductivity increases with the temperature.

The term "nanosized" means the size in between 0.1 nm and 999 nm, preferably 1 nm to 150 nm, more preferably 3 nm to 50 nm.

Thus, according to the present invention, "semiconducting light emitting nanoparticle" is taken to mean that the light emitting material which size is in between 0.1 nm and 999 nm, preferably 1 nm to 150 nm, more preferably 3 nm to 50 nm, having electrical conductivity to a degree between that of a conductor (such as copper) and that of an insulator (such as glass) at room temperature, preferably, a semiconductor is a material whose electrical conductivity increases with the temperature, and the size is in between 0.1 nm and 999 nm, preferably 0.5 nm to 150 nm, more preferably 1 nm to 50 nm.

According to the present invention, the term "size" means the average diameter of the longest axis of the semiconducting nanosized light emitting particles.

The average diameter of the semiconducting nanosized light emitting particles is calculated based on 100 semiconducting light emitting nanoparticles in a TEM image created by a Tecnai G2 Spirit Twin T-12 Transmission Electron Microscope.

In a preferred embodiment of the present invention, the semiconducting light emitting nanoparticle of the present invention is a quantum sized material.

According to the present invention, the term "quantum sized" means the size of the semiconducting material itself without ligands or another surface modification, which can show the quantum confinement effect, like described in, for example, ISBN: 978-3-662-44822-9.

For example, CdS, CdSe, CdTe, ZnS, ZnSe, ZnSeS, ZnTe, ZnO, GaAs, GaP, GaSb, HgS, HgSe, HgSe, HgTe, InAs, InP, InPS, InPZnS, InPZn, InPZnSe, InCdP, InPCdS, InPCdSe, InGaP, InGaPZn, InSb, AlAs, AlP, AlSb, $Cu_2S$, $Cu_2Se$, CuInS2, $CuInSe_2$, $Cu_2(ZnSn)S_4$, $Cu_2(InGa)S_4$, $TiO_2$ alloys and a combination of any of these can be used.

In a preferred embodiment of the present invention, the core comprises one element of the group 13 of the periodic table, and one element of the group 15 of the periodic table,

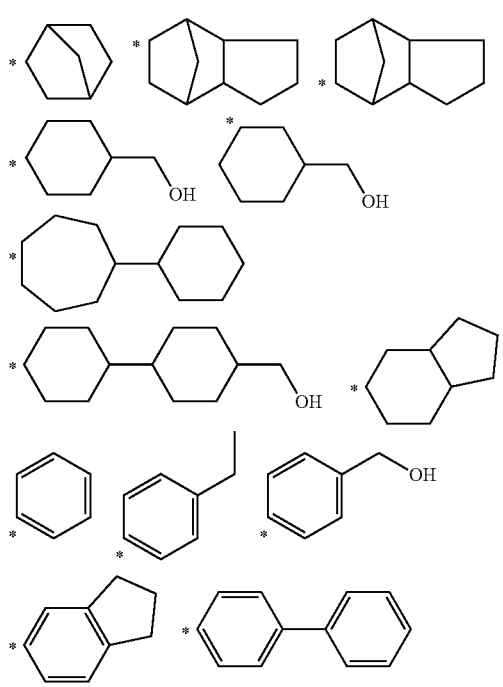

preferably the element of the group 13 is In, and the element of the group 15 is P, more preferably the core is selected from the group consisting of InP, InPZn, InPZnS, and InGaP.

According to the present invention, a type of shape of the core of the semiconducting light emitting nanoparticle, and shape of the semiconducting light emitting nanoparticle to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped core and-or a semiconducting light emitting nanoparticle can be synthesized.

In some embodiments of the present invention, the average diameter of the core is in the range from 1.5 nm to 3.5 nm.

The average diameter of the core is calculated based on 100 semiconducting light emitting nanoparticles in a TEM image created by a Tecnai G2 Spirit Twin T-12 Transmission Electron Microscope.

In some embodiments of the present invention, the shell layer comprises or a consisting of a $1^{st}$ element of group 12 of the periodic table and a $2^{nd}$ element of group 16 of the periodic table, preferably, the $1^{st}$ element is Zn, and the $2^{nd}$ element is S, Se, or Te.

In a preferred embodiment of the present invention, the shell layer is shell layer is represented by following formula (V), $$ZnS_xSe_yTe_z \qquad (V)$$

wherein 0≤x≤1, 0≤y≤1, 0≤z≤1, and x+y+z=1, preferably 0≤x≤1, 0≤y≤1, z=0, and x+y=1, preferably, the shell layer is ZnSe, $ZnS_xSe_y$, $ZnSe_yTe_z$ or $ZnS_xTe_z$.

In some embodiments of the present invention, said shell layer is an alloyed shell layer or a graded shell layer, preferably said graded shell layer is $ZnS_xSe_y$, $ZnSe_yTe_z$, or $ZnS_xTe_z$, more preferably it is $ZnS_xSe_y$.

In some embodiments of the present invention, the semiconducting light emitting nanoparticle further comprises $2^{nd}$ shell layer onto said shell layer, preferably the $2^{nd}$ shell layer comprises or a consisting of a $3^{rd}$ element of group 12 of the periodic table and a $4^{th}$ element of group 16 of the periodic table, more preferably the $3^{rd}$ element is Zn, and the $4^{th}$ element is S, Se, or Te with the proviso that the $4^{th}$ element and the $2^{nd}$ element are not same.

In a preferred embodiment of the present invention, the $2^{nd}$ shell layer is represented by following formula (V'), $$ZnS_xSe_yTe_z \qquad (V')$$

wherein the formula (V''), 0≤x≤1, 0≤y≤1, 0≤z≤1, and x+y+z=1, preferably, the shell layer is ZnSe, $ZnS_xSe_y$, $ZnSe_yTe_z$, or $ZnS_xTe_z$ with the proviso that the shell layer and the $2^{nd}$ shell layer is not the same.

In some embodiments of the present invention, said $2^{nd}$ shell layer can be an alloyed shell layer.

In some embodiments of the present invention, the semiconducting light emitting nanoparticle can further comprise one or more additional shell layers onto the $2^{nd}$ shell layer as a multishell.

According to the present invention, the term "multishells" stands for the stacked shell layers consisting of three or more shell layers.

For example, CdSe/CdS, CdSeS/CdZnS, CdSeS/CdS/ ZnS, ZnSe/CdS, CdSe/ZnS, InP/ZnS, InP/ZnSe, InP/ZnSe/ ZnS, InZnP/ZnS, InZnP/ZnSe, InZnP/ZnSe/ZnS, InGaP/ ZnS, InGaP/ZnSe, InGaP/ZnSe/ZnS, InZnPS/ZnS, InZnPS ZnSe, InZnPS/ZnSe/ZnS, ZnSe/CdS, ZnSe/ZnS or combination of any of these, can be used. Preferably, InP/ZnS, InP/ZnSe, InP/ZnSe/ZnS, InZnP/ZnS, InZnP/ZnSe, InZnP/ ZnSe/ZnS, InGaP/ZnS, InGaP/ZnSe, InGaP/ZnSe/ZnS.

Such semiconducting light emitting nanoparticles are publically available (for example from Sigma Aldrich) and/ or can be synthesized with the method described for example in U.S. Pat. No. 7,588,828 B, 8,679,543 B and Chem. Mater. 2015, 27, pp 4893-4898.

In some embodiments of the present invention, the composition comprises two or more semiconducting light emitting nanoparticles.

In some embodiments of the present invention, the composition comprises a plurality of semiconducting light emitting nanoparticles.

In some embodiments of the present invention, the total amount of the inorganic part of the semiconducting light emitting nanoparticle is in the range from 0.1 wt. % to 90 wt. % based on the total amount of the composition, preferably from 5 wt. % to 70 wt. %, more preferably from 10 wt. % to 50 wt. %.

Additional Ligand

In some embodiments of the present invention, optionally, the semiconducting light emitting nanoparticle can be directly over coated by an additional ligand together with the polymer, or the outer most surface of the inorganic part of the semiconducting light emitting nanoparticle can be directly coated by the additional ligand and the additional ligand is further coated by the polymer.

As the additional ligands, phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Oleylamine, Dedecyl amine (DDA), Tetradecyl amine (TDA), Hexadecyl amine (HDA), and Octadecyl amine (ODA), Oleylamine (OLA), 1-Octadecene (ODE), thiols such as hexadecane thiol and hexane thiol; mercapto carboxylic acids such as mercapto propionic acid and mercapto undecanoic acid; carboxylic acids such as oleic acid, stearic acid, myristic acid; acetic acid, Polyethylenimine (PEI) and a combination of any of these can be used.

Examples of such ligands have been described in, for example, the laid-open international patent application No. WO 2012/059931A.

Additional Material

In some embodiments of the present invention, said composition can further comprise at least one additional material, preferably the additional material is selected from the group consisting of organic light emitting materials, inorganic light emitting materials, charge transporting materials, scattering particles, optically transparent polymers, anti-oxidants, radical quenchers, radical quenchers, photo initiators and surfactants.

For example, said activator can be selected from the group consisting of $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, $Bi^{3+}$, $Pb^{2+}$, $Mn^{2+}$, $Yb^{2+}$, $Sm^{2+}$, $Eu^{2+}$, $Dy^{2+}$, $Ho^{2+}$ and a combination of any of these, and said inorganic fluorescent material can be selected from the group consisting of sulfides, thiogallates, nitrides, oxynitrides, silicate, aluminates, apatites, borates, oxides, phosphates, halophosphates, sulfates, tungstenates, tantalates, vanadates, molybdates, niobates, titanates, germinates, halides based phosphors, and a combination of any of these.

Such suitable inorganic fluorescent materials described above can be well known phosphors including nanosized phosphors, quantum sized materials like mentioned in the phosphor handbook, $2^{nd}$ edition (CRC Press, 2006), pp. 155-pp. 338 (W. M. Yen, S. Shionoya and H. Yamamoto), WO2011/147517A, WO2012/034625A, and WO2010/095140A.

According to the present invention, as said organic light emitting materials, charge transporting materials, any type of publically known materials can be used preferably. For example, well known organic fluorescent materials, organic host materials, organic dyes, organic electron transporting materials, organic metal complexes, and organic hole transporting materials.

For examples of scattering particles, small particles of inorganic oxides such as $SiO_2$, $SnO_2$, CuO, CoO, $Al_2O_3$, $TiO_2$, $Fe_2O_3$, $Y_2O_3$, ZnO, MgO; organic particles such as polymerized polystyrene, polymerized PMMA; inorganic hollow oxides such as hollow silica or a combination of any of these; can be used preferably.

According to the present invention, as a transparent polymers, a wide variety of publically known transparent polymers suitable for optical devices, described in for example, WO 2016/134820A can be used preferably.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

According to the present invention the term "polymer" means a material having a repeating unit and having the weight average molecular weight (Mw) 1000 g/mol, or more.

The molecular weight $M_w$ is determined by means of GPC (=gel permeation chromatography) against an internal polystyrene standard.

In some embodiments of the present invention, the glass transition temperature (Tg) of the transparent polymer is 70° C. or more and 250° C. or less.

Tg is measured based on changes in the heat capacity observed in Differential scanning colorimetry like described in http://pslc.ws/macrog/dsc.htm; Rickey J Seyler, Assignment of the Glass Transition, ASTM publication code number (PCN) 04-012490-50.

For example, as the transparent polymer for the transparent matrix material, poly(meth)acrylates, epoxys, polyurethanes, polysiloxanes, can be used preferably.

In a preferred embodiment of the present invention, the weight average molecular weight (Mw) of the polymer as the transparent matrix material is in the range from 1,000 to 300,000 g/mol, more preferably it is from 10,000 to 250,000 g/mol.

Formulation

In another aspect, the present invention relates to a formulation comprising, essentially consisting of, or consisting of the composition,
and
at least one solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, and dichlorobenzene, preferably said solvent is propylene glycol alkyl ether acetates, alkyl acetates, ethylene glycol monoalkyl ethers, propylene glycol, and propylene glycol monoalkyl ethers; preferably the solvent is selected from one or more members of the group consisting of propylene glycol alkyl ether acetates, such as, propylene glycol monomethyl ether acetate (PGMEA), alkyl acetates such as butyl acetate, ethylene glycol monoalkyl ethers such as ethylene glycol monobutyl ether, propylene glycol or propylene glycol monoalkyl ethers such as methoxypropanol, more preferably the solvent is selected from propylene glycol alkyl ether acetates.

In some embodiments, the formulation can further comprises an additional material. The details of the additional material is described in the section of "Additional material".

Use

In another aspect, the present invention relates to use of the composition, or a formulation, in an electronic device, optical device, in a biomedical device or for fabricating an electronic device, optical device or a biomedical device.

Optical Medium

In another aspect, the present invention further relates to an optical medium comprising the composition or the formulation, preferably the optical medium comprises the composition.

In some embodiments of the present invention, the optical medium can be an optical sheet, for example, a color filter, color conversion film, remote phosphor tape, or another film or filter.

According to the present invention, the term "sheet" includes film and/or layer like structured mediums.

In order to enhance out-coupling efficiency from an optical medium comprising the semiconductoring light emitting nanoparticle, for example, a quantum sized material containing optical film, several methods are proposed, such as incorporating scattering particles in the film and/or the adjacent films, reduce the refractive index of the film by incorporating hollow silica particles, and placing suitable shape structure (cf. Proceedings of SPIE, P. 184, 5519-33, 2004). Among them, placing the structured film upon the quantum materials containing film is the most suitable for large TV application in which local dimming technique is applied to achieve high dynamic range. The scattering particles are detrimental to the dimming technique, since the scattered light causes a color blur and reducing the refractive index of the film enough for a practical level is difficult because of the limited volume for the hollow silica particles. The combination of reducing the refractive index and placing the structured film can be also applied.

Optical Device

In another aspect, the invention further relates to an optical device comprising the optical medium.

In some embodiments of the present invention, the optical device can be a liquid crystal display device (LCD), Organic Light Emitting Diode (OLED), backlight unit for an optical display, Light Emitting Diode device (LED), Micro Electro Mechanical Systems (here in after "MEMS"), electro wetting display, or an electrophoretic display, a lighting device, and/or a solar cell.

The term "emission" means the emission of electromagnetic waves by electron transitions in atoms and molecules.

Technical Effects of the Invention

1. The present invention provides a novel composition, and a formulation comprising one or more of semiconducting light emitting nanoparticles showing improved dispersibility of said semiconducting light emitting nanoparticles in the composition, formulation and ./ or in a film.
2. The present invention provides a novel composition, and a formulation, comprising one or more of semiconducting light emitting nanoparticles showing improved initial Quantum Yield of said semiconducting light emitting nanoparticles in the composition, formulation and ./ or in a film.
3. The present invention provides a novel composition, and a formulation, comprising one or more of semiconducting light emitting nanoparticles showing long term stability and stable Quantum Yield of said semiconducting light emitting nanoparticles in the composition, formulation and ./ or in a film.
4. The present invention provides a novel composition, and a formulation, comprising one or more of semiconducting light emitting nanoparticles, showing higher Optical Density ("OD") at an excitation wavelength.
5. The present invention provides a novel composition, and a formulation, comprising one or more of semiconducting light emitting nanoparticles, showing better dispersibility of the semiconducting light emitting nanoparticles at higher concentration.

The working examples 1-8 below provide descriptions of the present invention, as well as an in detail description of their fabrication.

WORKING EXAMPLES

Working Example 1: Fabrication of a Composition Comprising a Semiconductor Light Emitting Nanoparticle Ligand Exchange 0.45 g of the red CdSe/CdS quantum materials (hereafter "the red QMs") having ODPA ligands in $CHCl_3$ solution are added dropwise to 0.594 g of BYK®-163 in $CHCl_3$ solution in a flask.

Then the obtained mixture is stirred with a magnetic stirrer for 18 hours at 60° C. in $N_2$ atmosphere. After 18 hours of stirring, the mixture is further stirred for 2 hours at 80° C. in $N_2$ atmosphere Preparation of a Composition Then 2.271 g of di-cyclopentanyl acrylate is added into the obtained mixture and $CHCl_3$ is evaporated by rotary evaporator to get a composition. Then, 0.032 mg of photo initiator Irgacure® TPO is further mixed with the composition.

Finally, composition A is obtained. The concentration of the red QMs with ligands in the obtained total amount of composition A is 14 wt %.

Working Example 2: Fabrication of a Composition Comprising a Semiconductor Light Emitting Nanoparticle Composition B is obtained in the same manner as described in the working example 1, except for 1,4-cyclohexanedimethanol mono acrylate is used instead of di-cyclopentanyl acrylate.

Working Example 3: Fabrication of Optical Films

The photo-sensitive composition A is coated onto a cleaned glass substrate with bar coating technique.

Then the resulting substrate is exposed to 2.0 mW/cm2 of 365 nm light emission for 5 minutes in nitrogen atmosphere. Then the optical film A is obtained.

The optical film B is obtained in the same manner as described above, instead of composition B is used instead of composition A.

Working Example 4

Optical Observation and Quantum Yield Calculation

Optical Observation

Fluorescent microscopic photo images of the optical films A and B are created by OLYMPUS BX-51 equipped with fluorescent mirror unit U-MWIB3. Table 1 shows the results of the observation.

TABLE 1

| Sample name | Aggregation of the quantum materials in a film |
|---|---|
| Film A | No aggregation |
| Film B | No aggregation |

As shown in the table 1, no aggregation of quantum materials in film A and film B are observed.

QY Calculation

Quantum Yield (QY) measurements of composition A and B are carried out by using Absolute PL quantum yield spectrometer C9920-02 (Hamamatsu Photonics K.K.), and following formula is used.

Quantum yield (QY)=emitted photon number from the sample/absorbed photon number of the sample.

Table 2 shows the results of the QY calculation.

TABLE 2

| Sample name | QY |
| --- | --- |
| Composition A | 0.65 |
| Composition B | 0.68 |

Working Example 5: Fabrication of a Composition Comprising a Semiconducting Light Emitting Nanoparticle Ligand Exchange 0.296 g of green CdSe/CdS quantum materials having ODPA ligands (hereafter "the green QMs") dispersed in chloroform are added dropwise to 0.342 g of BYK®-163 in $CHCl_3$ solution in a flask.

Then the obtained mixture is stirred with a magnetic stirrer for 18 hours at 60° C. in $N_2$ atmosphere. After 18 hours of stirring, the mixture is further stirred for 2 hours at 80° C. in $N_2$ atmosphere Preparation of a Composition Then 1.447 g of di-cyclopentanyl acrylate is added into the obtained mixture and $CHCl_3$ is evaporated by rotary evaporator to get a composition.

Then, 0.021 mg of photo initiator Irgacure® TPO is further mixed with the composition.

Finally, composition C is obtained. The concentration of the green QMs with ligands in the obtained total amount of composition C is 14 wt %.

Working Example 6: Fabrication of a Composition Comprising a Semiconducting Light Emitting Nanoparticle Ligand Exchange 0.1 g of InP based green quantum materials (hereafter "the InP based green QMs") dispersed in chloroform are added dropwise to 0.053 g of BYK®-163 in $CHCl_3$ solution in a flask.

Then the obtained mixture is stirred with a magnetic stirrer for 18 hours at 60° C. in $N_2$ atmosphere. After 18 hours of stirring, the mixture is further stirred for 2 hours at 80° C. in $N_2$ atmosphere Preparation of a Composition Then, 0.357 g of di-cyclopentanyl acrylate is added into the obtained mixture and $CHCl_3$ is evaporated by rotary evaporator to get a composition.

Then, 5.1 mg of photo initiator Irgacure® TPO is further mixed with the composition.

Finally, composition C is obtained. The concentration of the InP based green QMs with ligands in the obtained total amount of composition C is 19 wt. %.

Working Example 7: Fabrication of Optical Films

Then the optical films C and D are fabricated in the same manner as described in working example 3, except for composition C, D are used instead of composition A, B.

Working Example 8

Optical Observation and Quantum Yield Calculation

Optical observation of films C and D, and QY calculation of composition C and D are carried out in the same manner as described in working example 4.

Table 3 shows the results of the observation.

TABLE 3

| Sample name | Aggregation of the quantum materials in a film |
| --- | --- |
| Film C | No aggregation |
| Film D | No aggregation |

As shown in the table 3, no aggregation of quantum materials in film C and no aggregation of quantum materials in film D are observed.

Table 4 shows the results of the QY calculation.

TABLE 4

| Sample name | QY |
| --- | --- |
| Composition C | 0.77 |
| Composition D | 0.62 |

The invention claimed is:
1. A composition comprising
   i) at least one semiconducting light emitting nanoparticle comprising a core and one or more shell layers,
   ii) at least one polymer,
   wherein the polymer comprises at least:
   a repeating unit A comprising a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, and
   a repeating unit B that does not include any phosphine group, phosphine oxide group, phosphate group, phosphonate group, thiol group, tertiary amine, carboxyl group, hetero cyclic group, silane group, sulfonic acid, hydroxyl group, phosphonic acid or combination of thereof, and
   iii) at least one (meth)acrylate represented by following chemical formula (I),

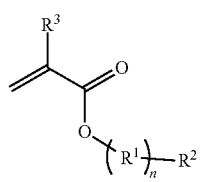

(I)

wherein n is 0 or 1, $R^1$ is a straight alkylene chain or alkoxylene chain having 1 to 15 carbon atoms, $R^2$ is a branched or cyclic alkyl or alkoxy group having 3 to 40 carbon atoms, which may in each case be substituted by one or more radicals $R^a$, where one or more non-adjacent $CH_2$ groups may be replaced by $R^aC=CR^1$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

R$^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents R$^a$ here may also form a mono- or polycyclic, aliphatic, aromatic or heteroaromatic ring system with one another; R$^3$ is H or CH$_3$, wherein the polymer is a copolymer selected from the group consisting of graft copolymers, block copolymers, alternating copolymers, and random copolymers.

2. The composition according to claim 1, wherein the repeating unit A comprises a tertiary amine represented by following chemical formula (II),

NR$^4$R$^5$R$^6$— (II)

wherein R$^4$ is a hydrogen atom, a straight or a branched alkyl group having 1 to 30 carbon atoms, or an aryl group having 1 to 30 carbon atoms; R$^5$ is a hydrogen atom, a straight or a branched alkyl group having 1 to 30 carbon atoms, or an aryl group having 1 to 30 carbon atoms; R$^4$ and R$^5$ can be same or different of each other; R$^6$ is a single bond, a straight or a branched alkylene group having 1 to 30 carbon atoms, alkenylene group having 1 to 30 carbon atoms, (poly)oxaalkylene group having 1 to 30 carbon atoms.

3. The composition according to claim 1, the core comprises one element of the group 13 of the periodic table, and one element of the group 15 of the periodic table.

4. The composition according to claim 1, wherein at least one of the shell layers comprises a 1$^{st}$ element of group 12 of the periodic table, and a 2$^{nd}$ element of group 16 of the periodic table.

5. The composition according to claim 1, wherein at least one shell layer is represented by following formula (V),

ZnS$_x$Se$_y$Te$_z$ (V)

wherein 0≤x≤1, 0≤y≤1, 0≤z≤1, and x+y+z=1.

6. The composition according to claim 1, wherein said shell layers of the semiconducting light emitting nanoparticle are double shell layers.

7. The composition according to claim 1, wherein the composition further comprises at least one additional material selected from the group consisting of organic light emitting materials, inorganic light emitting materials, charge transporting materials, scattering particles, optically transparent polymers, anti-oxidants, radical quenchers, photo initiators and surfactants.

8. The composition according to claim 1, wherein the composition comprises a plurality of semiconducting light emitting nanoparticles.

9. The composition according to claim 1, wherein the total amount of the semiconducting light emitting nanoparticle is in the range from 0.1 wt % to 90 wt % based on the total amount of the composition.

10. A formulation comprising the composition according to claim 1, and at least one solvent selected from one or more members of the group consisting of ethylene glycol monoalkyl ethers, selected from the group consisting of ethylene glycol monomethyl ether, ethylene glycol monoethyl ether, ethylene glycol monopropyl ether, and ethylene glycol monobutyl ether;

diethylene glycol dialkyl ethers, selected from the group consisting of diethylene glycol dimethyl ether, diethylene glycol diethyl ether, diethylene glycol dipropyl ether, and diethylene glycol dibutyl ether;

propylene glycol monoalkyl ethers, selected from the group consisting of propylene glycol monomethyl ether (PGME), propylene glycol monoethyl ether, and propylene glycol monopropyl ether;

ethylene glycol alkyl ether acetates, selected from the group consisting of methyl cellosolve acetate and ethyl cellosolve acetate;

propylene glycol alkyl ether acetates, selected from the group consisting of propylene glycol monomethyl ether acetate (PGMEA), propylene glycol monoethyl ether acetate, and propylene glycol monopropyl ether acetate;

ketones, selected from the group consisting of methyl ethyl ketone, acetone, methyl amyl ketone, methyl isobutyl ketone, and cyclohexanone;

alcohols, selected from the group consisting of ethanol, propanol, butanol, hexanol, cyclo hexanol, ethylene glycol, and glycerin;

esters, selected from the group consisting of ethyl 3-ethoxypropionate, methyl 3-methoxypropionate and ethyl lactate;

cyclic asters, which includes gamma-butyro-lactone; and chlorinated hydrocarbons, selected from the group consisting of chloroform, dichloromethane, chlorobenzene, and dichlorobenzene.

11. A method which comprises including a composition according to claim 1 or a formulation comprising a composition according to claim 1 and a solvent in an electronic device, optical device, in a biomedical device or for fabricating an electronic device, optical device or a biomedical device.

12. An optical medium comprising the composition according to claim 1 or a formulation comprising a composition according to claim 1 and a solvent.

13. An optical device comprising said optical medium according to claim 12.

14. The composition according to claim 1, wherein the repeating unit A of the polymer comprises a tertiary amine, phosphine oxide group, phosphonic acid, or a phosphate group, R1 is a straight alkylene chain or alkoxylene chain having 1 to 10 carbon atoms, more preferably 1 to 5 carbon atoms, and R2 is a cyclic alkyl or alkoxy group having 3 to 40 carbon atoms.

15. The composition according to claim 1 wherein the copolymer is a block copolymer represented by following chemical formula (III) or (IV),

A$_n$-B$_m$ (III)

B$_o$-A$_n$-B$_m$ (IV)

wherein the symbol "A" represents a repeating unit A; the symbol "B" is taken to mean the repeating unit B; the symbols "n", "m", and "o" are at each occurrence, independently or dependently of each other, integers 1 to 100.

16. The composition according to claim 15 wherein the repeating unit B of the copolymer comprises a polymer chain selected from the group consisting of (poly)ethylene, (poly)phenylene, polydivinylbenzene, (poly)ethers, (poly)esters, (poly)amides, (poly)urethanes, (poly)carbonates, polylactic acids, (poly)vinylesters, (poly)vinylethers, polyvinyl alcohols, polyvinylpyrrolidones, and celluloses.

17. The composition according to claim 3, wherein the core is selected from the group consisting of InP, InPZn, InPZnS, and InGaP.

18. The composition according to claim 4, wherein the $1^{st}$ element of group 12 of the periodic table is Zn or Cd, and the $2^{nd}$ element of group 16 of the periodic table is S, Se, or Te.

19. The composition according to claim 5, wherein at least one shell layer is ZnS or ZnSe.

20. The composition according to claim 9, wherein the total amount of the semiconducting light emitting nanoparticle is in the range from 5 wt % to 70 wt %, based on the total amount of the composition.

21. The composition according to claim 9, wherein the total amount of the semiconducting light emitting nanoparticle is in the range from 20 wt % to 50 wt %, based on the total amount of the composition.

22. The formulation according to claim 10, wherein the solvent is selected from one or more members of the group consisting of
propylene glycol alkyl ether acetates, including propylene glycol monomethyl ether acetate (PGMEA),
alkyl acetates, including butyl acetate,
ethylene glycol monoalkyl ethers including ethylene glycol monobutyl ether and propylene glycol and
propylene glycol monoalkyl ethers, including methoxypropanol.

23. The composition according to claim 1, wherein the said polymer is not a conductive polymer.

* * * * *